(12) United States Patent
Scalisi et al.

(10) Patent No.: US 9,111,189 B2
(45) Date of Patent: Aug. 18, 2015

(54) APPARATUS AND METHOD FOR MANUFACTURING AN ELECTRONIC PACKAGE

(75) Inventors: Joseph F. Scalisi, Yorba Linda, CA (US); David M. Morse, Laguna Hills, CA (US); David Butler, Rugeley (GB)

(73) Assignee: Location Based Technologies, Inc., Irvine, CA (US)

( * ) Notice: Subject to any disclaimer, the term of this patent is extended or adjusted under 35 U.S.C. 154(b) by 1989 days.

(21) Appl. No.: 11/933,024

(22) Filed: Oct. 31, 2007

(65) Prior Publication Data

US 2009/0111393 A1    Apr. 30, 2009

(51) Int. Cl.
| | |
|---|---|
| *H04B 7/00* | (2006.01) |
| *B29C 45/14* | (2006.01) |
| *G06K 19/07* | (2006.01) |
| *H05K 3/28* | (2006.01) |
| *B29L 31/34* | (2006.01) |

(52) U.S. Cl.
CPC ...... *G06K 19/0723* (2013.01); *B29C 45/14639* (2013.01); *H05K 3/284* (2013.01); *B29L 2031/3456* (2013.01); *H05K 2203/1316* (2013.01); *H05K 2203/1322* (2013.01); *Y10T 428/239* (2015.01)

(58) Field of Classification Search
None
See application file for complete search history.

(56) References Cited

U.S. PATENT DOCUMENTS

| | | | |
|---|---|---|---|
| 3,924,102 A * | 12/1975 | Hanekom | 219/497 |
| 4,218,582 A | 8/1980 | Hellman et al. | |
| 4,850,007 A | 7/1989 | Marino et al. | |
| 5,079,541 A | 1/1992 | Moody | |
| 5,127,042 A | 6/1992 | Gillig et al. | |
| 5,353,331 A | 10/1994 | Emery et al. | |
| 5,386,468 A | 1/1995 | Akiyama et al. | |
| 5,410,748 A * | 4/1995 | Hayashi et al. | 455/277.1 |
| 5,432,542 A | 7/1995 | Thibadeau et al. | |
| 5,541,976 A | 7/1996 | Ghisler | |
| 5,555,286 A | 9/1996 | Tendler | |
| 5,565,909 A | 10/1996 | Thibadeau et al. | |
| 5,592,173 A | 1/1997 | Lau et al. | |
| 5,785,181 A | 7/1998 | Quartarao, Jr. | |

(Continued)

FOREIGN PATENT DOCUMENTS

| | | |
|---|---|---|
| JP | 10325735 | 12/1998 |
| JP | 11064480 | 3/1999 |

(Continued)

OTHER PUBLICATIONS

Greg H. Huff Directional Reconfigurable Antennas on Laptop . . . , IEEE Transactions on Antennas, vol. 52, No. 12, Dec. 2004, pp. 3220-3227, USA, see attached.

(Continued)

*Primary Examiner* — Gennadiy Tsvey

(57) ABSTRACT

An apparatus to package an electronic device. The apparatus includes a composite plastic package that is durable to environmental conditions. In particular, a mold process to produce a plastic composite material package and support an electronic component inserted therein. At least one injection nozzle supplies a specified level of plastic composite material into the mold to produce a substantially hermetically sealed package. A multi-patch antenna provides increased receiver sensitivity. An inductive battery power option provides a user flexibility to charge a tracking device and communicate near-field signals and energy with a tracking monitoring station.

10 Claims, 13 Drawing Sheets

(56) References Cited

U.S. PATENT DOCUMENTS

| | | |
|---|---|---|
| 5,862,511 A | 1/1999 | Croyle et al. |
| 5,876,765 A | 3/1999 | Hinterlechner |
| 5,967,841 A | 10/1999 | Bianca et al. |
| 5,973,599 A | 10/1999 | Nicholson et al. |
| 6,088,453 A | 7/2000 | Shimbo |
| 6,141,356 A | 10/2000 | Gorman |
| 6,236,365 B1 | 5/2001 | LeBlanc et al. |
| 6,243,039 B1 | 6/2001 | Elliot |
| 6,278,370 B1 | 8/2001 | Underwood |
| 6,300,875 B1 | 10/2001 | Schafer |
| 6,327,533 B1 | 12/2001 | Chou |
| 6,388,612 B1 | 5/2002 | Neher |
| 6,414,629 B1 | 7/2002 | Curcio |
| 6,441,741 B1 | 8/2002 | Yoakum |
| 6,445,921 B1 | 9/2002 | Bell |
| 6,453,037 B1 | 9/2002 | Welter, Jr. |
| 6,498,797 B1 | 12/2002 | Anerousis et al. |
| 6,546,253 B1 | 4/2003 | Chow et al. |
| 6,611,755 B1 | 8/2003 | Coffee et al. |
| 6,633,835 B1 | 10/2003 | Moran et al. |
| 6,654,883 B1 | 11/2003 | Tatebayashi |
| 6,674,368 B2 | 1/2004 | Hawkins et al. |
| 6,708,028 B1 | 3/2004 | Byrne |
| 6,716,101 B1 | 4/2004 | Meadows |
| 6,732,090 B2 | 5/2004 | Shanahan et al. |
| 6,735,630 B1 | 5/2004 | Gelvin et al. |
| 6,747,561 B1 | 6/2004 | Reeves |
| 6,754,470 B2 | 6/2004 | Hendrickson et al. |
| 6,768,942 B1 | 7/2004 | Chojnacki |
| 6,774,838 B2 | 8/2004 | Sun |
| 6,778,089 B2 | 8/2004 | Yoakum |
| 6,812,824 B1 | 11/2004 | Goldinger et al. |
| 6,819,247 B2 | 11/2004 | Birnbach et al. |
| 6,833,787 B1 | 12/2004 | Levi |
| 6,850,252 B1 | 2/2005 | Hoffberg |
| 6,859,533 B1 | 2/2005 | Wang et al. |
| 6,879,244 B1 | 4/2005 | Scalisi |
| 6,882,897 B1 | 4/2005 | Fernandez |
| 6,928,280 B1 | 8/2005 | Xanthos et al. |
| 6,937,726 B1 | 8/2005 | Wang |
| 6,952,181 B2 | 10/2005 | Karr et al. |
| 6,975,941 B1 | 12/2005 | Lau |
| 6,978,021 B1 | 12/2005 | Chojnacki |
| 6,988,026 B2 | 1/2006 | Breed |
| 6,992,584 B2 | 1/2006 | Dooley et al. |
| 6,998,985 B2 | 2/2006 | Reisman et al. |
| 6,998,995 B2 | 2/2006 | Nakajima |
| 7,020,701 B1 | 3/2006 | Gelvin et al. |
| 7,038,590 B2 | 5/2006 | Hoffman et al. |
| 7,049,957 B2 | 5/2006 | Watson |
| 7,064,711 B2 | 6/2006 | Strickland et al. |
| 7,065,244 B2 | 6/2006 | Akimov |
| 7,065,348 B1 | 6/2006 | Aoki |
| 7,065,370 B2 | 6/2006 | Ogaki et al. |
| 7,079,650 B1 | 7/2006 | Knudsen |
| 7,088,242 B2 | 8/2006 | Aupperle et al. |
| 7,088,252 B2 | 8/2006 | Weekes |
| 7,099,921 B1 | 8/2006 | Engstrom et al. |
| 7,109,868 B2 | 9/2006 | Yoakum |
| 7,119,669 B2 | 10/2006 | Lundsgaard et al. |
| 7,120,928 B2 | 10/2006 | Sheth et al. |
| 7,139,396 B2 | 11/2006 | Montgomery et al. |
| 7,146,367 B2 | 12/2006 | Shutt |
| 7,149,189 B2 | 12/2006 | Huntington et al. |
| 7,155,238 B2 | 12/2006 | Katz |
| 7,158,912 B2 | 1/2007 | Vock et al. |
| 7,181,192 B2 | 2/2007 | Panasik et al. |
| 7,200,673 B1 | 4/2007 | Augart |
| 7,218,242 B2 | 5/2007 | Scalisi et al. |
| 7,246,007 B2 | 7/2007 | Ferman et al. |
| 7,257,836 B1 | 8/2007 | Moore |
| 7,268,700 B1 | 9/2007 | Hoffberg |
| 7,272,212 B2 | 9/2007 | Eberle et al. |
| 7,272,662 B2 | 9/2007 | Chesnais et al. |
| 7,284,191 B2 | 10/2007 | Grefenstette et al. |
| 7,292,223 B2 | 11/2007 | Suprun et al. |
| 7,299,277 B1 | 11/2007 | Moran et al. |
| 7,302,634 B2 | 11/2007 | Lucovsky et al. |
| 7,313,825 B2 | 12/2007 | Redlich et al. |
| 7,501,984 B2 * | 3/2009 | Forster et al. .......... 343/700 MS |
| 7,598,855 B2 | 10/2009 | Scalisi |
| 7,612,663 B2 | 11/2009 | Sun |
| 7,626,499 B2 | 12/2009 | Burneske et al. |
| 7,728,724 B1 | 6/2010 | Scalisi et al. |
| 7,995,994 B2 | 8/2011 | Khetawat et al. |
| 2001/0030667 A1 | 10/2001 | Kelts |
| 2001/0048364 A1 | 12/2001 | Kalthoff et al. |
| 2002/0041328 A1 | 4/2002 | LeCompte et al. |
| 2002/0067256 A1 | 6/2002 | Kail, IV |
| 2002/0077130 A1 | 6/2002 | Owensby |
| 2002/0180602 A1 | 12/2002 | Yoakum |
| 2002/0186135 A1 | 12/2002 | Wagner |
| 2002/0196123 A1 | 12/2002 | Diehl et al. |
| 2003/0043200 A1 | 3/2003 | Faieta et al. |
| 2003/0131073 A1 | 7/2003 | Lucovsky et al. |
| 2003/0177094 A1 | 9/2003 | Needham et al. |
| 2003/0208518 A1 | 11/2003 | Gura et al. |
| 2003/0210262 A1 | 11/2003 | Gahm et al. |
| 2003/0212729 A1 | 11/2003 | Eberle et al. |
| 2003/0235307 A1 | 12/2003 | Miyamoto |
| 2004/0010689 A1 | 1/2004 | Vanstone et al. |
| 2004/0021573 A1 | 2/2004 | Hoffman et al. |
| 2004/0165726 A1 | 8/2004 | Yamamichi et al. |
| 2004/0166879 A1 | 8/2004 | Meadows et al. |
| 2004/0172403 A1 | 9/2004 | Steele et al. |
| 2004/0212493 A1 * | 10/2004 | Stilp ............................ 340/531 |
| 2005/0012620 A1 | 1/2005 | Yoakum |
| 2005/0024201 A1 | 2/2005 | Culpepper et al. |
| 2005/0044356 A1 | 2/2005 | Srivastava et al. |
| 2005/0071282 A1 | 3/2005 | Lu et al. |
| 2005/0071736 A1 | 3/2005 | Schneider et al. |
| 2005/0099303 A1 | 5/2005 | Zuckerman |
| 2005/0113124 A1 | 5/2005 | Syrjarinne et al. |
| 2005/0145688 A1 | 7/2005 | Milenkovic et al. |
| 2005/0159883 A1 | 7/2005 | Humphries et al. |
| 2005/0181870 A1 * | 8/2005 | Nguyen et al. ................. 463/29 |
| 2005/0188403 A1 | 8/2005 | Kotzin |
| 2005/0210260 A1 | 9/2005 | Venkatesan et al. |
| 2005/0246647 A1 | 11/2005 | Beam et al. |
| 2005/0248459 A1 | 11/2005 | Bonalle et al. |
| 2006/0009152 A1 | 1/2006 | Millard et al. |
| 2006/0084420 A1 | 4/2006 | Smith et al. |
| 2006/0161377 A1 | 7/2006 | Rakkola et al. |
| 2006/0205416 A1 | 9/2006 | Kayzar et al. |
| 2006/0206246 A1 | 9/2006 | Walker |
| 2006/0211405 A1 | 9/2006 | Scalisi et al. |
| 2006/0232449 A1 | 10/2006 | Jain et al. |
| 2006/0253590 A1 | 11/2006 | Nagy et al. |
| 2006/0290497 A1 | 12/2006 | Sugata et al. |
| 2007/0028088 A1 | 2/2007 | Bayrak et al. |
| 2007/0033531 A1 | 2/2007 | Marsh |
| 2007/0053513 A1 | 3/2007 | Hoffberg |
| 2007/0054530 A1 | 3/2007 | Bauer et al. |
| 2007/0057068 A1 | 3/2007 | Tsai |
| 2007/0061303 A1 | 3/2007 | Ramer et al. |
| 2007/0073719 A1 | 3/2007 | Ramer et al. |
| 2007/0083819 A1 | 4/2007 | Shoemaker |
| 2007/0103296 A1 | 5/2007 | Paessel et al. |
| 2007/0159322 A1 | 7/2007 | Campbell |
| 2007/0229350 A1 | 10/2007 | Scalisi et al. |
| 2007/0255620 A1 | 11/2007 | Tumminaro et al. |
| 2007/0285247 A1 * | 12/2007 | Forster ........................ 340/572.1 |
| 2007/0287473 A1 | 12/2007 | Dupray |
| 2007/0288427 A1 | 12/2007 | Ramer et al. |
| 2008/0010585 A1 | 1/2008 | Schneider et al. |
| 2008/0028063 A1 | 1/2008 | Holmes et al. |
| 2008/0059504 A1 | 3/2008 | Barbetta et al. |
| 2008/0059889 A1 | 3/2008 | Parker et al. |
| 2008/0088437 A1 | 4/2008 | Aninye et al. |
| 2008/0090550 A1 | 4/2008 | Scalisi et al. |
| 2008/0108370 A1 | 5/2008 | Aninye |
| 2008/0109762 A1 | 5/2008 | Hundal et al. |
| 2008/0129491 A1 | 6/2008 | Ruperto et al. |
| 2008/0171559 A1 | 7/2008 | Frank et al. |

(56) References Cited

U.S. PATENT DOCUMENTS

| | | | |
|---|---|---|---|
| 2008/0172173 | A1 | 7/2008 | Chang et al. |
| 2008/0228654 | A1 | 9/2008 | Edge |
| 2008/0252254 | A1* | 10/2008 | Osada .......................... 320/108 |
| 2008/0252459 | A1* | 10/2008 | Butler et al. ............... 340/572.1 |
| 2009/0098857 | A1 | 4/2009 | De Atley |
| 2009/0098903 | A1 | 4/2009 | Donaldson et al. |
| 2009/0103722 | A1 | 4/2009 | Anderson et al. |
| 2009/0117921 | A1 | 5/2009 | Beydler et al. |
| 2009/0119119 | A1 | 5/2009 | Scalisi et al. |
| 2009/0174603 | A1 | 7/2009 | Scalisi et al. |
| 2009/0177385 | A1 | 7/2009 | Matas et al. |
| 2009/0189807 | A1 | 7/2009 | Scalisi et al. |
| 2009/0315706 | A1 | 12/2009 | Scalisi et al. |
| 2009/0315767 | A1 | 12/2009 | Scalisi et al. |
| 2012/0086571 | A1 | 4/2012 | Scalisi et al. |
| 2012/0089492 | A1 | 4/2012 | Scalisi et al. |

FOREIGN PATENT DOCUMENTS

| | | |
|---|---|---|
| JP | 13074494 | 3/2001 |
| WO | WO-2007107022 | 9/2007 |

OTHER PUBLICATIONS

Fredrick, "Smart Antennas Based on Spatial Multiplexing", IEEE Transactions on Antennas, vol. 52, No. 1, Jan. 2004; pp. 106-114, see attached.

www.City of Pasadena. Net . . . Pasadena Water & Power Website on "Electric vehicle (EV) Charging Information", see attached.

Magnolia BroadBand Internet Article entitled "Mobile Transmit Diversity", see attached.

Michael Hansen, "Overmolding: A Multifaceted Medical Device Technology:, Medical Device & Diagnostic Industry", see attached.

"Material Property Data for various Thermoplastic Elastomers", MATLAB, May 29, 2007, see attached.

Patrick Mannion, "Antenna Diversity Doubles CDMA Net Capacity", EE Times, May 12, 2003, see attached.

Steve Burk, "Overmolding of Embedded Electronics", http//cs.pennet.com/Articles/Article_Display.cfm . . . , see attached.

Schuster, Mike et al., "Increasing the Frequency Response of the ADXL Series Accelerometers", *Analog Devices Application Note AN-377*, (Feb. 2006),1 page.

"Small and Thin +_5g Accelerometer", *Analog Devices—ADXL320*, (2004),16 pages.

Matsakis, Demetrios "The Timing Group Delay (TGD) Correction and GPS Timing Basis", *Proceedings of the 63rd Annual Meeting of the Institute of Navigation*, Cambridge, MA, (Apr. 2007),6 pages.

"GPS Compass Solutions—Application vs. Accuracy", *CEACT Information Systems*, (Sep. 13, 2006),10 pages.

"ET301 GPS-UAV Development Platform", (Jul. 12, 2006),11 pages.

Lemaire, Christophe "Surface Micromachined Sensors for Vehicle Navigation Systems", *Analog Devices, Inc.*, Retrieved from the Internet from http://www.analog.com/en/content/0,2886,764%255F800%255F8077%255F0,00.html on Dec. 25, 2007.,(Dec. 2007),4 pages.

Li, Xiaojing et al., "The Complementary Characteristics of GPS and Accelerometer in Monitoring Structural Deformation", *ION 2005 Meeting*, (2005),9 pages.

Li, Xiaojing et al., "Full-Scale Structural Monitoring Using an Integrated GPS and Accelerometer System", *University of New South Wales*, (Feb. 14, 2006),15 pages.

\* cited by examiner

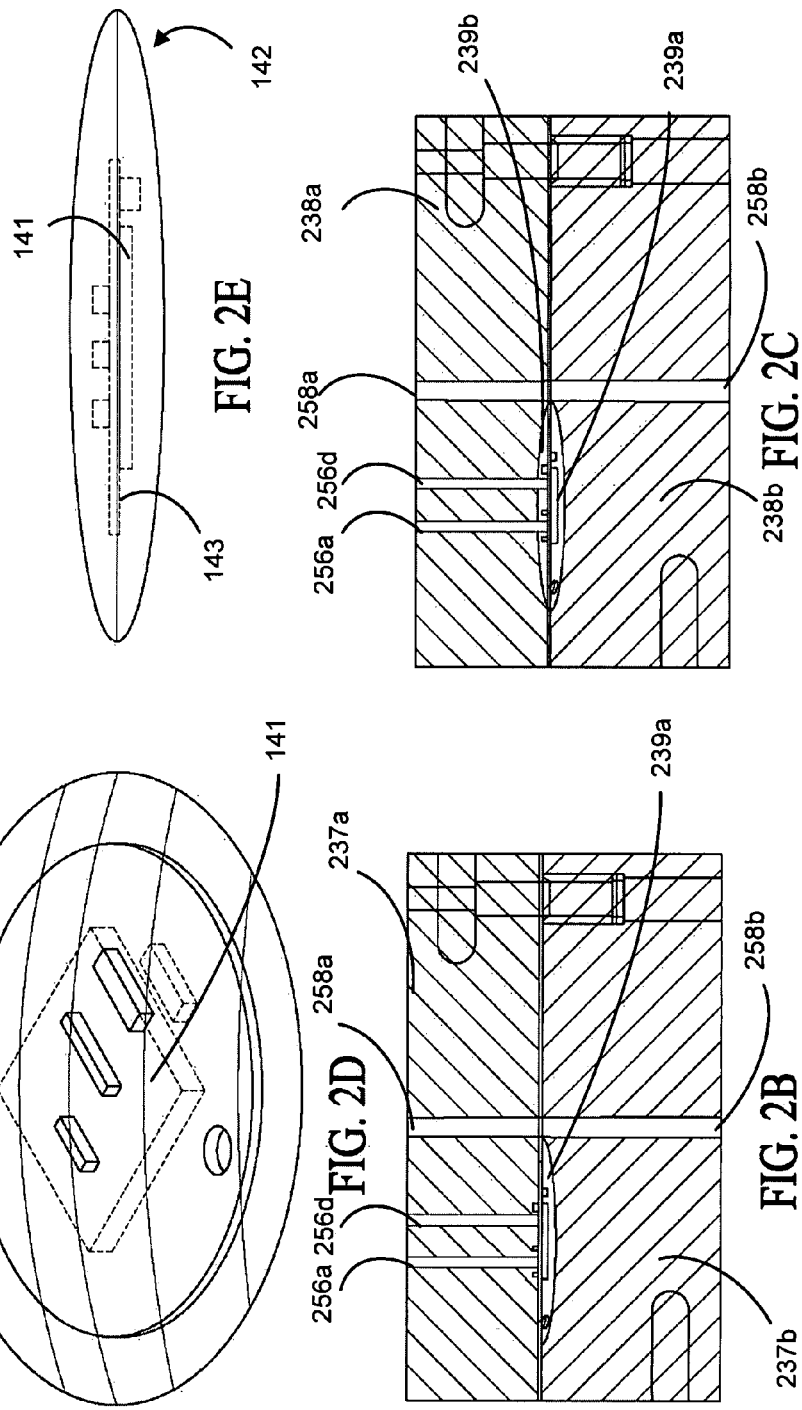

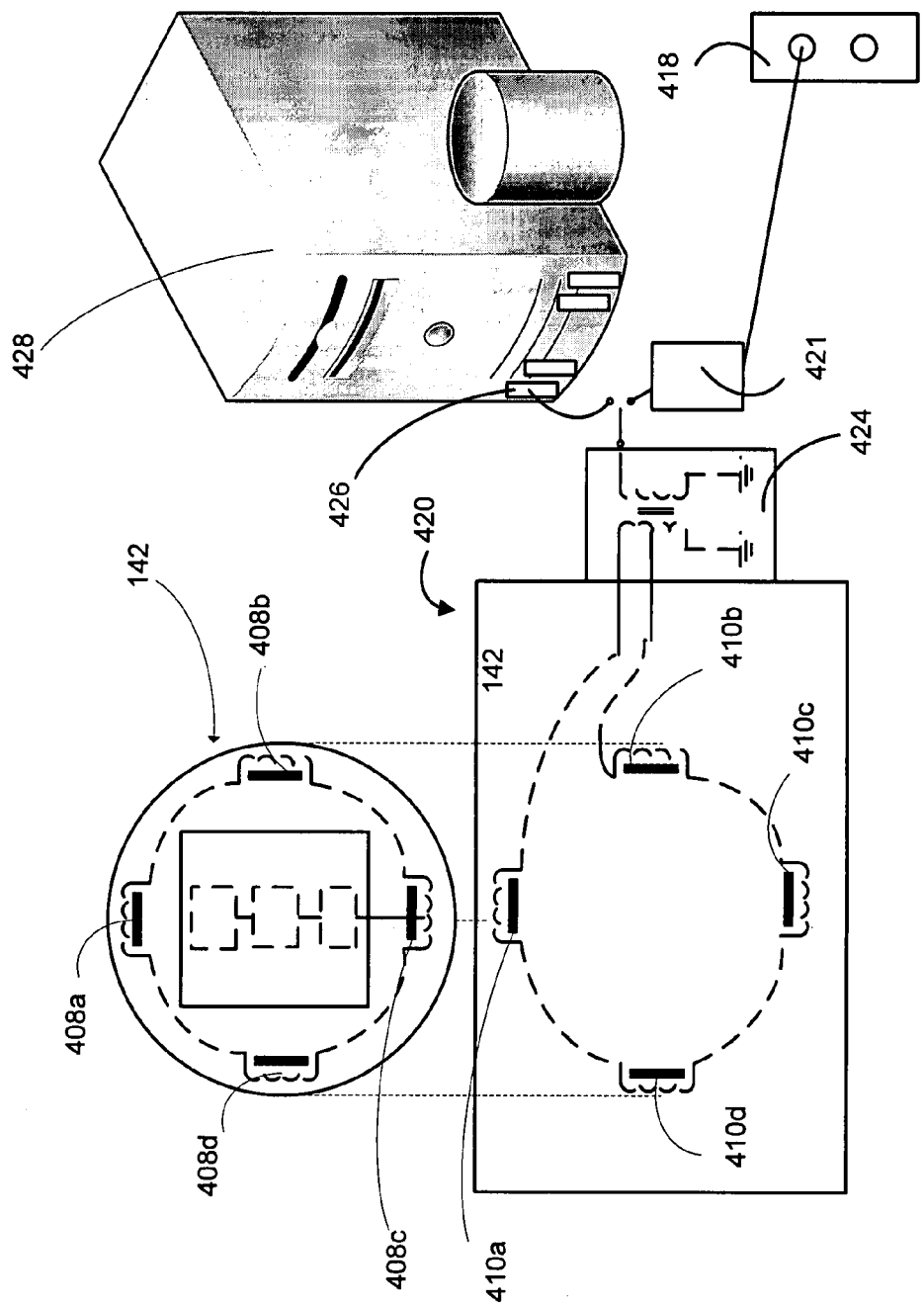

APPARATUS AND METHOD FOR MANUFACTURING AN ELECTRONIC PACKAGE

RELATED APPLICATION

This application incorporates by reference U.S. patent application Ser. No. 11/753,979 filed on May 25, 2007, entitled "Apparatus and Method for Providing Location Information on Individuals and Objects Using Tracking Devices."

BACKGROUND OF THE INVENTION

1. Field of the Invention

The invention relates generally to the field of electronic packaging. More particularly, the present invention relates in one embodiment to a diversity antenna incorporated as part of an electronic package for a wireless location and tracking system and/or wireless communication system (WCS).

2. Description of Related Technology

In conventional electronic packaging, a device (e.g., a printed circuit board, digital, analog, RF, or microwave integrated circuit) may be mounted into a cavity of a metal or plastic package. A lid placed over the package partially shields the device from its environment. Electrical connectors or adapters (such as coax, SMA, twin-lead, wiring-harness, RF or DC pad, RF or DC feed-through) connect components on the device to one or more external devices such as power supplies, networks and communication systems. These conventional electronic packaging processes have potentially disadvantages including high assembly costs, questionable durability (such as mechanical resistance to shock and vibration), as well as long lead time machine tooling.

Conventional circuit encapsulation methods include mounting a printed circuit board (PCB) or integrated circuit (to produce an RFID—Radio Frequency Identification Device) within one or more multi-layer plastic sheets. Other conventional electronic packaging methods include encasing a transponder in a sealed member, overmolding devices having a ferrite, powdered metal and magnet core materials and associated circuitry, integrally molding an RFID tag "in situ" within a plastic body or forming a series of injection-molded segments containing separate electrical or mechanical components. Accordingly, various prior art patents disclose plastic, ceramic, and metallic packages for transponders and RFID devices (e.g., US Published Patent Applications 20020180602, 20020196123, 20050248459, 20060290497, and issued U.S. Pat. Nos. 5,967,841, 5,973,599, 6,882,897, 5,785,181 which are herein incorporated by reference).

One important property for an electronic tracking device is durability. For instance, children, Alzheimer's syndrome patients or mentally ill persons, carrying an electronic tracking device may cause the device to strike a hard or sharp surface. Wild animals tagged with an electronic tracking device may expose the device to water when exiting or entering a lake, stream, or snowfall. In addition, continued monitoring of a discarded electronic device under harsh environmental conditions (e.g., when placed in a trash receptacle) may assist locating a lost or abducted individual.

Other important properties of an electronic tracking device include receiver sensitivity as well as antenna directivity. For instance, a GPS satellite, GPS repeater station, or RF base station needs to maintain communication with an electronic tracking device. For many conventional electronic tracking devices, internal antennas may be generally categorized into patch and quadrifilar helix antennas. In one conventional system, a patch antenna and a low noise amplifier mounted along a horizontal plane of an electronic tracking device provides antenna directivity in accordance with a hemispherical response but provides poor receiver sensitivity when the device is positioned on its edge (e.g., aligned along a vertical plane in an individual's shirt pocket). In another conventional system, a quadrifilar helical antenna mounted along a vertical plane of the electronic tracking device occupies a large restate area; thus, miniaturization of an electronic package size is compromised. Furthermore, a quadrifilar helical antenna mounted along a vertical plane provides poor receiver sensitivity when the electronic tracking device is not aligned in a skyward fashion.

Other important properties of an electronic tracking device include an ability to replenish its battery level and as well as provide a means of efficient data transfer, e.g., when a device battery is charging and may be electrically connected to a remote terminal, e.g., a location coordinate monitoring station. Many conventional electronic tracking devices power replenish and recharge capability is limited to physically plugging a port of the electronic tracking device into a standard electrical wall outlet or, in yet another instance, physical replacement of a device battery. Furthermore, many conventional electronic tracking devices provide signal transfer capability limited to direct connection of the electronic tracking device to a sub-station or central location coordinate monitoring station.

In summary, a novel electronic tracking device package is needed to produce a durable device that provides enhanced electrical properties, e.g., improved receiver sensitivity, and antenna directivity, and other advantages in one or more embodiments such as one or more battery level charging options, remote signal processing, data and software update options, and a deterrent to reverse engineering schematics and hardware configurations of the electronic tracking device.

SUMMARY OF THE INVENTION

In a first aspect of the present invention, an electronic apparatus for a tracking device is disclosed. The electronic apparatus includes a transceiver, a first patch antenna, and a second patch antenna. The first patch antenna is disposed on a first side of the tracking device. The second patch antenna is disposed on a second side of the tracking device. The first patch antenna and the second patch antenna are configured to periodically communicate signals to a signal processor to determine communication signal strength, battery power management, and data responsiveness to antenna directivity and receiver sensitivity.

In one embodiment, an electronic package is deposited on the electronic apparatus by an injection process. In one variant, the injection process applies a thermoplastic resin in a first fill pattern and in a second fill pattern on the electronic apparatus. In one variant, the first fill pattern and the second fill pattern substantially seal the electronic apparatus. In another variant, the first fill pattern and the second fill pattern form a package that substantially camouflages the electronic apparatus from viewing by unauthorized individuals.

In a second aspect of the present invention, an injection-molded article is disclosed. The article includes an integrated circuit disposed on a substrate, a first protective molding and a second protective molding. The first protective molding formed by a first thermoplastic resin disposed on the integrated circuit. The second protective molding formed by a second thermoplastic resin to substantially seal at least one portion of an exposed area surrounding the integrated circuit.

The first and the second protective moldings are injected to substantially provide low loss near field communication to a wireless communication network and a durable package to the integrated circuit to moisture and shock variation.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages and features of the invention are realized and attained by means of the instrumentalities, procedures, and combinations particularly pointed out in the appended claims.

BRIEF DESCRIPTION OF THE DRAWINGS

FIG. 2B illustrates a side view of a mold tool to inject a thermoplastic resin into a first fill area in accordance with an embodiment of the present invention.

FIG. 2C illustrates a side view of a mold tool to inject a thermoplastic resin into a second fill area in accordance with an embodiment of the present invention.

FIG. 2D illustrates a perspective view of a PCB illustrated in FIGS. 2A-2C for electronic packaging in accordance with an embodiment of the present invention.

FIG. 2E illustrates a side view of an electronic package produced by molding tools shown in FIGS. 2A-2C in accordance with an embodiment of the present invention.

FIG. 4A illustrates wireless battery charging circuitry of a tracking device and an inductive charging pad in accordance with an embodiment of the present invention.

DETAILED DESCRIPTION

Figure 1:
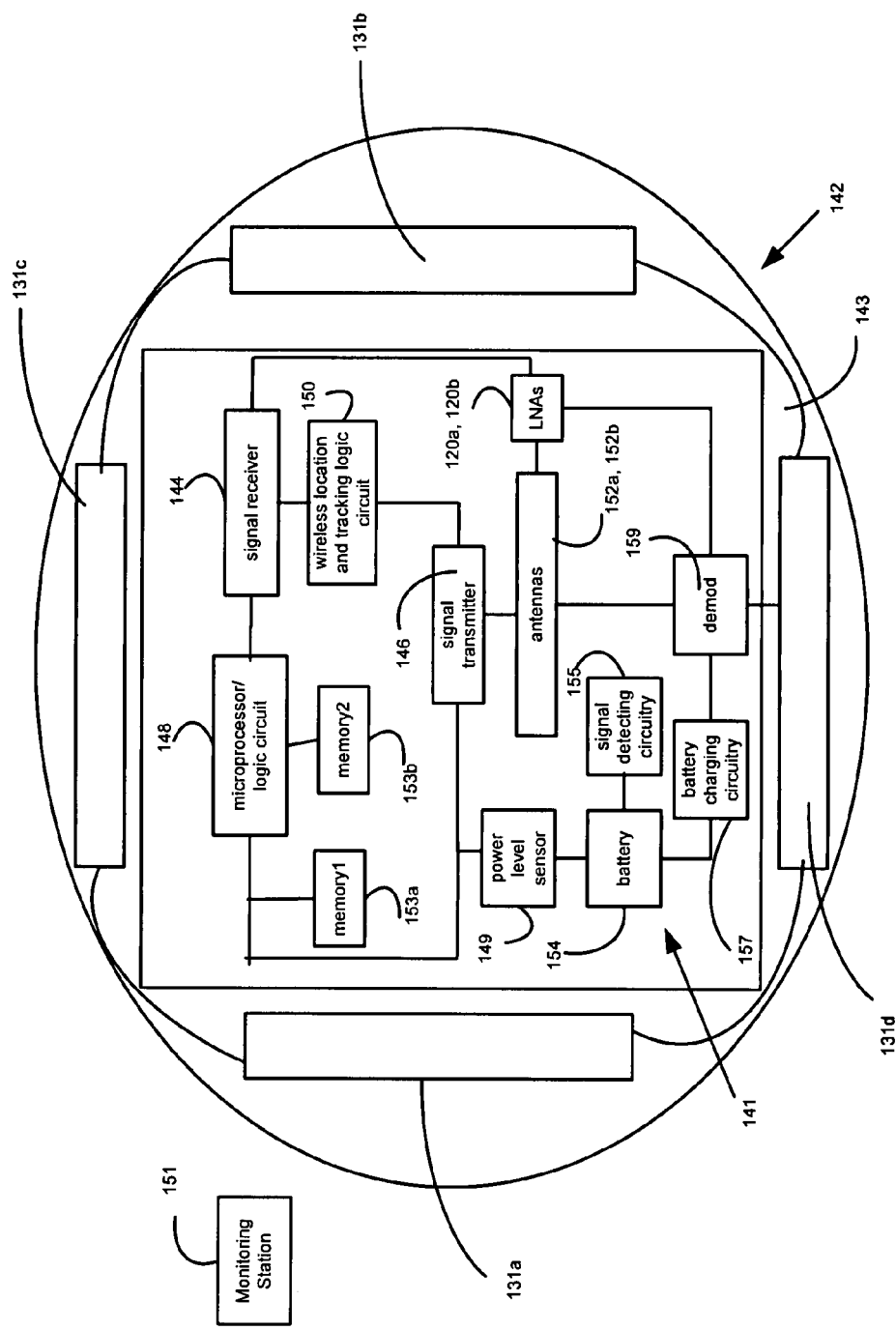
FIG. 1 illustrates an electrical block diagram of a tracking device in accordance with an embodiment of the present invention.

Reference is now made to the drawings wherein like numerals refer to like parts throughout.

As used herein, the terms "location coordinates" refer without limitation to any set or partial set of integer, real and/or complex location data or information such as longitudinal, latitudinal, and elevational positional coordinates.

As used herein, the terms "tracking device" refers to without limitation to any hybrid electronic circuit, integrated circuit (IC), chip, chip set, system-on-a-chip, microwave integrated circuit (MIC), Monolithic Microwave Integrated Circuit (MMIC), low noise amplifier, power amplifier, transceiver, receiver, transmitter and Application Specific Integrated Circuit (ASIC) that may be constructed and/or fabricated. The chip or IC may be constructed ("fabricated") on a small rectangle (a "die") cut from, for example, a Silicon (or special applications, Sapphire), Gallium Arsenide, or Indium Phosphide wafer. The IC may be classified, for example, into analogue, digital, or hybrid (both analogue and digital on the same chip and/or analog-to-digital converter). Digital integrated circuits may contain anything from one to millions of logic gates, invertors, and, or, nand, and nor gates, flipflops, multiplexors, etc. on a few square millimeters. The small size of these circuits allows high speed, low power dissipation, and reduced manufacturing cost compared with board-level integration.

As used herein, the terms "wireless data transfer", "wireless tracking and location system", "positioning system," and "wireless positioning system" refer without limitation to any wireless system that transfers and/or determines location coordinates using one or more devices, such as Global Positioning System (GPS). The terms "Global Positioning System" refer to without limitation to any services, methods or devices that utilize GPS technology that determine a position of a GPS receiver based on measuring signal transfer times between satellites having known positions and the GPS receiver. The signal transfer time of a signal is proportional to a distance of a respective satellite from the GPS receiver. The distance between a satellite and a GPS receiver may be converted, utilizing signal propagation velocity, into a respective signal transfer time. The positional information of the GPS receiver is calculated based on distance calculations from at least four satellites to determine positional information of the GPS receiver.

As used herein, the terms "wireless network" refers to, without limitation, any digital, analog, microwave, and millimeter wave communication networks that transfer signals from one location to another location, such as IEEE 802.11g, Bluetooth, WiMax, IS-95, GSM, IS-95, CGM, CDMA, wCDMA, PDC, UMTS, TDMA, and FDMA, or any combinations thereof.

Major Features

In one aspect, the present invention discloses an apparatus and method of providing an electronic packaging apparatus using an injection molding process to manufacture a substantially shockproof, waterproof unit for a tracking device. In one embodiment, the unit provides a diversity antenna capable of improving receiver sensitivity. In one embodiment, the unit prevents unauthorized reverse engineering of electronic components contained therein. In other embodiment, inductive circuitry enables near-field wireless charging and data communication between a tracking device and a battery charger and/or a remote monitoring station to potentially improve user ease of use and decrease a user's communication costs. As described though out the following specification, the present invention generally provides packaging of tracking devices for locating and tracking an individual or an object. More specifically, the package of the present invention is substantially durable in nature to withstand harsh environmental conditions and/or hard surface impacts that may occur before location is determined of a missing, lost, or abducted person, Alzheimer's syndrome patient, mentally ill person, or a criminal by a guardian or law enforcement authority.

The present invention may be used to provide a package for a tracking device concealed on an individual in one (or more) form factor(s). Form factors may include a pen carried in a pocket or backpack, an inner surface of a shoe, a button, a necklace, a toy, a shirt collar, and decoration, fabric of a jacket or sweater, or the like. Various device skins are available to camouflage a tracking device. A device skin, such as a plastic sticker or housing, attaches to a tracking device to blend a tracking device appearance with that of an object or individual to prevent discovery by an abductor (as compared to being incorporated as part of a conspicuous device, e.g., a mobile phone, pager, personal data assistant). In one exemplary embodiment, the tracking device may be a personal locator device implanted under an individual's skin. The personal locating device may, in one example, have capability of inductively charging its battery, for instance, utilizing an inductive charging technology, methodology or apparatus described supra in FIGS. 4A-4D. In one variant, a battery of a personal locator tracking device may be trickle-charged in response to an individual movement's (e.g. using technology similar to a flashlight that charges its battery level in response to user providing a shaking or back and forth motion to the flashlight).

The present invention discloses, in one embodiment, a substantially waterproof and shockproof device and, in one instance, substantially sealed and having no exposed metal contacts. Consequently, if the tracking device is submerged in water (such as when the tracking device is inadvertently washed in a washing machine as part of laundry) or exposed to cold temperature conditions, e.g., snow, the device remains functional. The tracking device may also find use monitoring and locating lost or stolen animals and objects, such as vehicles, goods and merchandise. Please note that the following discussions of manufacturing a tracking device to monitor and locate individuals is non-limiting and the present invention may be useful in other electronic packaging applications, such as watches, calculators, clocks, computer keyboards, computer mice, mobile phones and the like.

Exemplary Apparatus

Referring now to FIGS. 1-5 exemplary embodiments of the electronic packaging system of the invention are described in detail. It will be appreciated that while described primarily in the context of tracking individuals or objects, at least portions of the apparatus and methods described herein may be used in other applications, such as, utilized, without limitation, for control systems that monitor components such as transducers, sensors, and electrical and/or optical components that are part of an assembly line process. Moreover, it will be recognized that the present invention may find utility beyond purely tracking and monitoring concerns. Myriad of other functions will be recognized by those of ordinary skill in the art given the present disclosure.

Electronic Packaging

Figure 2A:
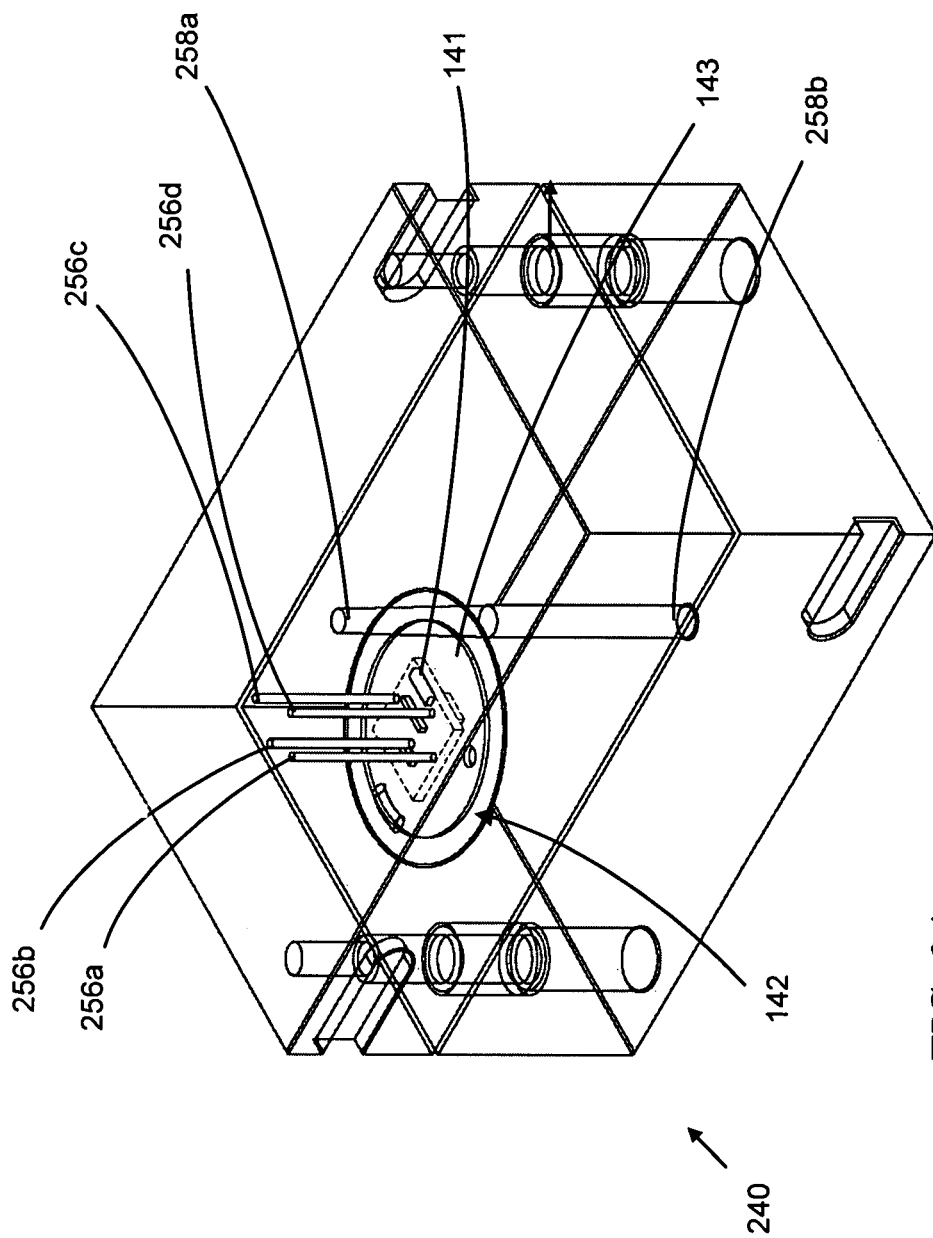
FIG. 2A illustrates a perspective top view of a mold tool to produce an electronic package for an electrical component in accordance with an embodiment of the present invention.
Figure 2F:
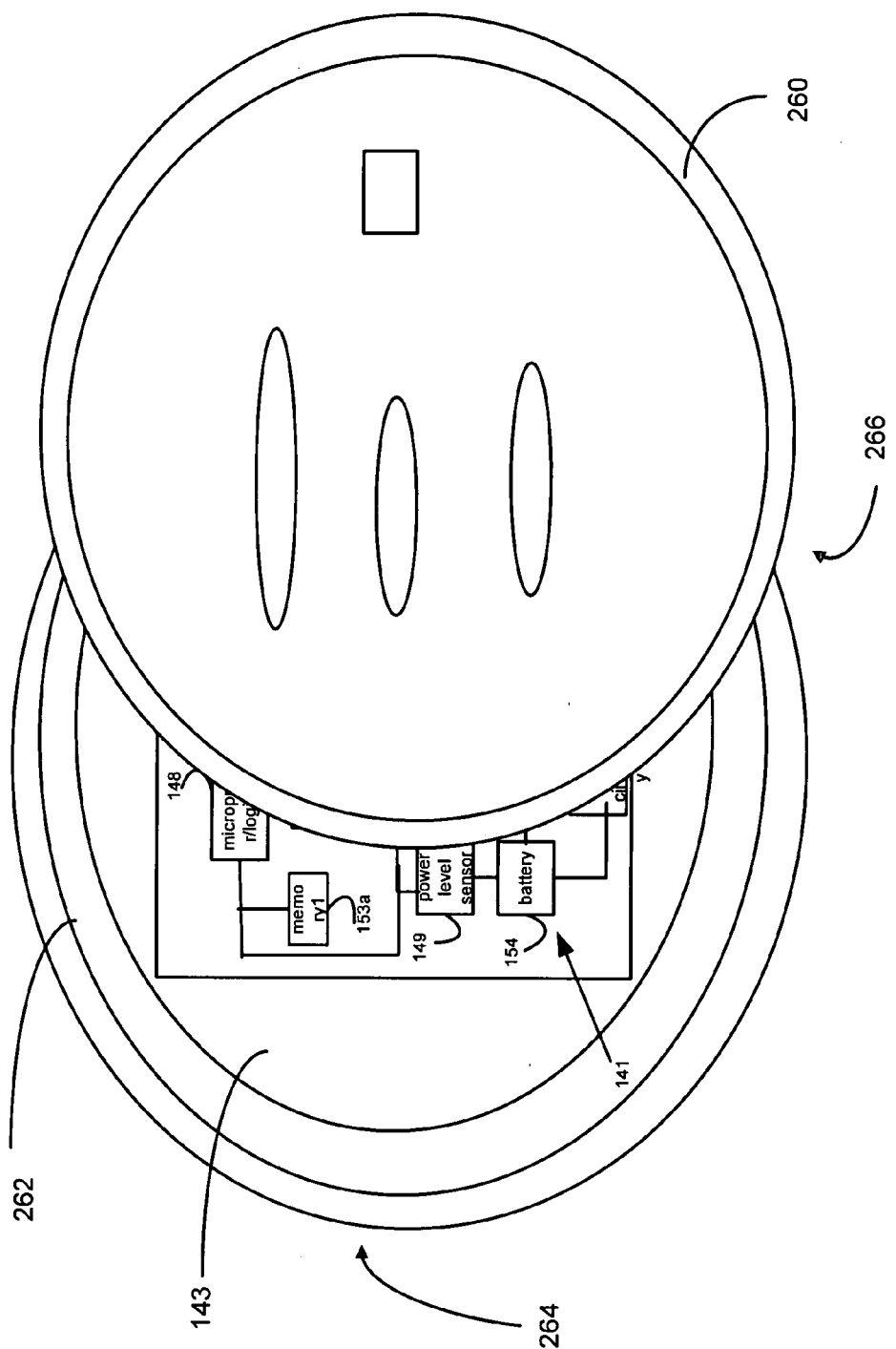
FIG. 2F illustrates a two-piece mating electronic package produced using the processing steps described with reference to FIGS. 2A-2E in accordance with an embodiment of the present invention.

Referring to FIG. 1, the electronic components 141 insert into the mold tooling 240 (depicted in FIG. 2A). The electronic components 141 include a signal receiver 144, a signal transmitter 146, and a microprocessor/logic circuit 148. In one embodiment, the electronic components 141 are disposed, deposited, or mounted on a substrate (such as a circuit board (PCB) 143). The PCB 143, for example, may be manufactured from: polyacryclic (PA), polycarbonate, (PC) composite and arylonitrile-butadiene-styrene (ABS) substrates, blends or combinations thereof, or the like. The microprocessor/logic circuit 148 is configured to store a first identification code (of the tracking device 142), produce a second identification code, determine location coordinates of the tracking device 142 and generate a positioning signal that contains location data (as described in U.S. patent application Ser. No. 11/753,979 filed on May 25, 2007, previously incorporated herein by reference). For instance, the location data includes longitudinal, latitudinal, and elevational position of a tracking device, current address or recent address of the tracking device, a nearby landmark to the tracking device, and the like.

In one embodiment, a positioning system logic circuit, e.g., wireless location and tracking logic circuit 150, calculates location data sent to the microprocessor/logic circuit 148 from a monitoring station 151. Memory1 153a and memory2 153b store operating software and data, for instance, communicated to and from the microprocessor/logic circuit 148 and/or the wireless location and tracking logic circuit 150. A power level sensor 149 detects a receive signal power level. Signal detecting circuitry 155 detects a battery level of battery 154, which may contain one or more individual units or be grouped as a single unit.

One or more antennas 152a, 152b connect, in this example, to the signal transmitter 146 and the signal receiver 144. In one variant, the signal transmitter 146 and the signal receiver 144 may be replaced by a transceiver circuit, chip, or integrated circuit. The signal transmitter 146 transmits a signal including location data from a tracking device 142 to the monitoring station 151. The signal receiver 144 receives a signal from the monitoring station 151, for example, by wireless data transfer, e.g., wireless telephone communication or via an Internet electronic message. A demodulator circuit 159 extracts baseband signals, for instance at 100 KHz, including tracking device configuration and software updates, as well as converts a low-frequency AC signal to a DC voltage level. The DC voltage level, in one example, is supplied to battery charging circuitry 157 to recharge a battery level of the battery 154. The blocks 131a-d, in this example, represents battery charging components (such as inductors 408a-d described supra with reference to FIGS. 4A-4D).

In one embodiment, a user of a monitoring station 151 by listening (or downloading) one or more advertisements may reduce and/or shift phone usage charges to another user, account, or database (as disclosed in U.S. patent application Ser. No. 11/784,400 entitled "Communication System and Method Including Dual Mode Capability" and Ser. No. 11/784,318 entitled "Communication System and Method Including Communication Billing Options" each filed on Apr. 5, 2007, herein incorporated by reference).

Referring to FIG. 2A, a mold tool 240 supports the PCB board 143 (including the electronic components 141 shown in FIG. 1) in accordance with an embodiment of the present invention. Retractable pins 256a-d support the PCB 143 within the mold tooling 240. The mold tooling 240, in this non-limiting example, produces a tracking device 142 to conform to a desired electronic package shape, for example, a shape of a button. Furthermore, the molding tool 240, in another example, forms the tracking devices 402, 410 (from the application Ser. No. 11/753,979 incorporated previously by reference). In other embodiments, dimensionality of a mold tool conforms to a desired tracking device dimensionality, e.g., a lapel pin, button, shirt collar, shoe insert, pen, belt buckle and the like.

The following is a non-limiting example of the present invention. The mold tool 240 includes one or more molds (e.g., first mold 237a, second mold 237b, third mold 238a, fourth mold 238b) forming one or more internal cavity areas, such as molding areas 239a, 239b shown in FIG. 2B, 2C, respectively. A plastic composite material is flowed into the molding areas 239a, 239b to encapsulate, e.g., substantially seal, the tracking device 142. In one embodiment, the plastic composite material flows through at least one of the openings 258a, 258b to fill, for instance, the molding area 239a and/or the molding area 239b. If a printed circuit board was utilized, e.g., PCB 143, the PCB may be formed by any of the following: a polycarbonate acrylic-styrene (PC/ABS), polycarbonate (PC), acrylic-styrene (ABS) chemical composition, polymer, polyurethane, polycarbonate-urethane (PCU), thermoplastic, or blends thereof. For encapsulating the tracking device 142 using one or more molds, the plastic composite material, for example, may be a thermoset plastic, thermoplastic resin, polymer, polycarbonate, elastomer, urethane, urethane elastomer, polyurethane, copolymers, thermoplastic vulcanizates, thermoplastic urethanes, olefinics, copolyamides, arylonitrile-butadiene-styrene (ABS), or blends thereof.

Processing properties of the plastic composite material include melt temperature, mold temperature, mold dimensionality and injection pressure. The processing properties, for instance, depend on a manufacturing lot and material composition as well as whether electronic components 141 to encapsulate are one or more integrated circuits or a PCB 143. In this non-limiting example, manufacturer specifications conform to those by Bayer Polymers, the Polymer Technology Group and the Teknor Apex Company. More specifically, urethane elastomer processing parameters include a melt temperature between 150 to 250 degrees C., a mold temperature between 30 to 45 degrees C., and an injection pressure between 30 to 50 MPa. A drying process may follow opening of first mold 237a, 237b and/or second mold 238a, 238b and removal of the tracking device 142. Afterwards, the tracking device 142 substantially replicates a combined form factor of first mold 237a, a second mold 237b, a third mold 238a, and fourth mold 238b. Consequently, the tracking device 142 conforms to physical features (e.g., belt buckles, button on a shirt, inner surface of a shoe, or the like) of the mold tooling.

Referring to FIG. 2B, one or more electronic components 141, such as packaged integrated circuits, resistors and capacitors, disposed on a PCB (such as PCB 143) are encapsulated in the first molding process. In particular, during the first molding process, a first mold 237a and a second mold 237b form a cavity, e.g., a first fill area 239a, to fill a first region on the PCB 143 using a plastic composite material, e.g., selected from the materials described above. In this example, the first region includes an active region of the electronic components 141. Referring to FIG. 2C, in a second molding process, a third mold 238a and fourth mold 238b form a second region. The second region, for instance, is a second fill area 239b. The second fill area 239b, for example, is an area about an outer region of the first filling area 339a for filing with a plastic composite material, to further process the PCB 143 coated with a first fill area 239a.

Following one or more of the molding processes, for instance the first and the second molding process, an injection step may be required to intermediately cure the plastic composite material. This curing step may include having the composite plastic material remain in a mold until sufficient hardening occurs, or it may include a sequence of steps of actively heating or cooling the plastic composite material within or outside of the mold to achieve a desired uniformity and consistency. For instance, if the composite plastic material is a thermoset plastic material, the curing step may be automatic due to its inherent chemical properties. For thermoset plastic material, however, it may be generally advantageous to cool to hasten its solidification.

In one embodiment, retractable pins 256a-d, shown in FIG. 2A, are capable of providing PCB 143 support during injection mold processing. In one embodiment, injection mold may involve a sequential or parallel arrangement of injections of one or more plastic composite materials, (e.g., chemical compositions and/or varieties of a heated thermoplastic resin) to fill areas (e.g., fill area 239a, fill area 239b) on the PCB 143. In one embodiment, an integrated circuit, such as circuits 146, 150 depicted in FIG. 1, are sealed in a first fill area 239a during a first molding process. The first molding process may include a plastic composite material of a first type. Thus, advantageously, subsequent molding processes, such as a second molding process, having a second fill area 239b, may, in one embodiment, utilize a plastic composite material of the first type or, in the alternative, a second type, e.g., optimized for a property different than the first type.

For instance, the second fill area 239b may be optimized for moisture and chemical resistance properties and the first fill area 239a may be optimized for high resistance to breakage and stress. Consequently, this invention, in one embodiment, by using multiple types, multiple level polymers, injection processing may provide custom injection tailoring on per unit area basis on the PCB 143 to achieve one or more desired electronic packaging properties. The electronic packaging properties may include tensile strength, hardness, and flexural modulus, tear strength, coefficient of temperature expansion, flammability, brittleness, linear mold shrinkage, specific gravity and melt flow. Thus, this embodiment of custom tailored layering as opposed to conventional single application polymer processing provides a tracking device having a non-uniform profile wireless communication conducting packages.

Furthermore, the present process eliminates a need for first sealing an integrated circuit, e.g., before beginning an injection processing, such as requiring an integrated circuit to be packaged in a ferrite, ceramic lead package, or the like to prevent circuitry degradation. Thus, multiple level sealing process of an electronic circuit (such as electronic components 141) using the present invention provides for improved electronic package throughput and improved package performance, e.g., improved electrostatic discharge (ESD) protection for active devices, disposed in a first fill area 239a. Still other advantages of the present processing include improved communication properties for electronic components, such as electronic components 141. In one embodiment, a system designer places signal communicating apparatus, e.g., antennas 152a, 152b proximate to the electrical components 141 in a first fill area. In yet another embodiment, the signal communication apparatus, e.g., antennas 152a, 152b may be disposed (external to the first fill area) within a second fill area 239b. Thus, a user may selectively choose a plastic composite material in the first fill area 239a to improve wireless communication (e.g., provide increased signal isolation) for signal sensitive components. Furthermore, a user may choose a second fill area 239b for improve signal-reception (for instance if the signal communication apparatus (e.g., antennas 152a, 152b are present in this area) or to enhance other electronic properties such as filtering, tensile strength, or density modulus in a second fill area 239b.

Figure 3A:
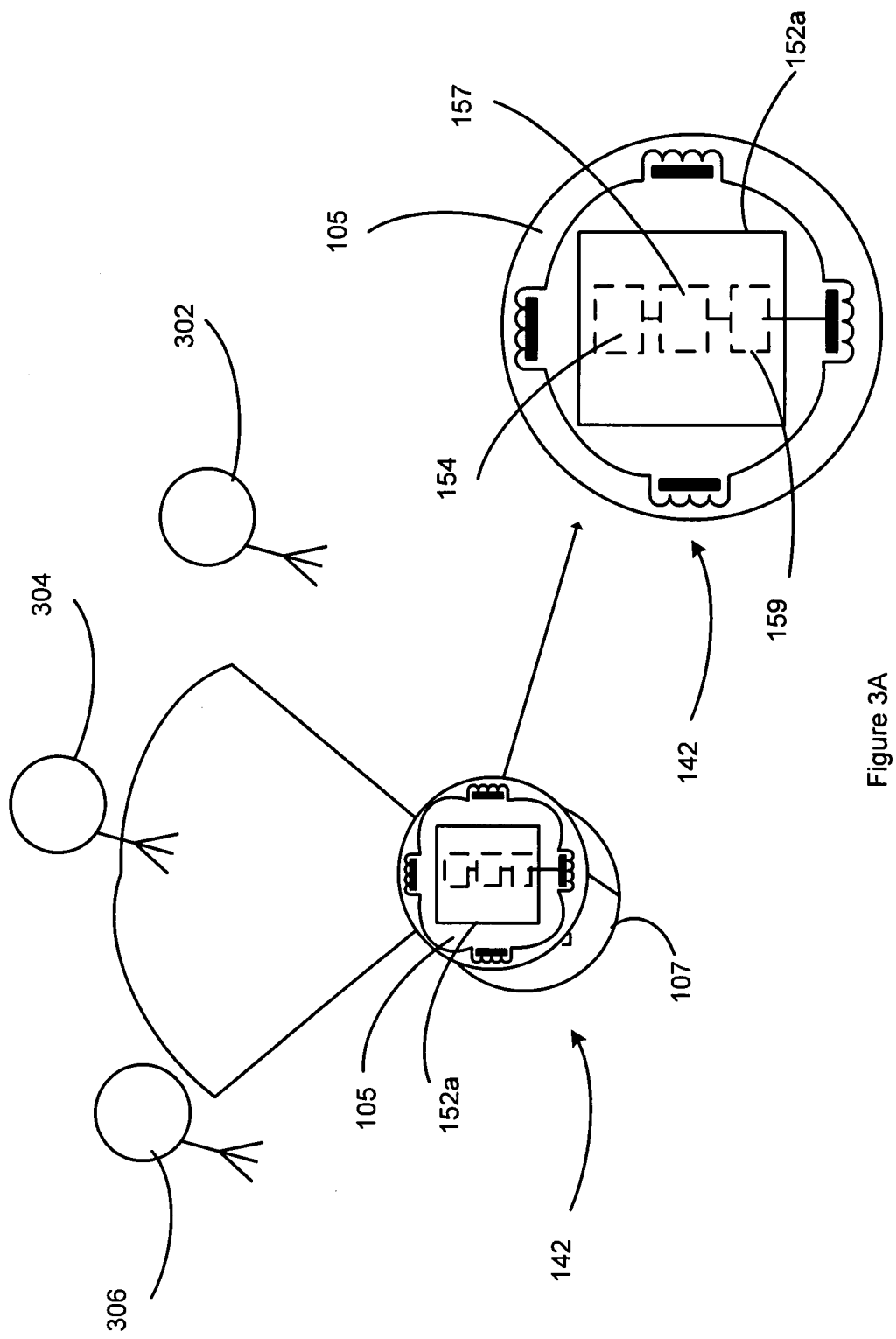
FIG. 3A illustrates a diversity antenna located on a first side of a tracking device to support message communication in accordance with an embodiment of the present invention.
Figure 3B:
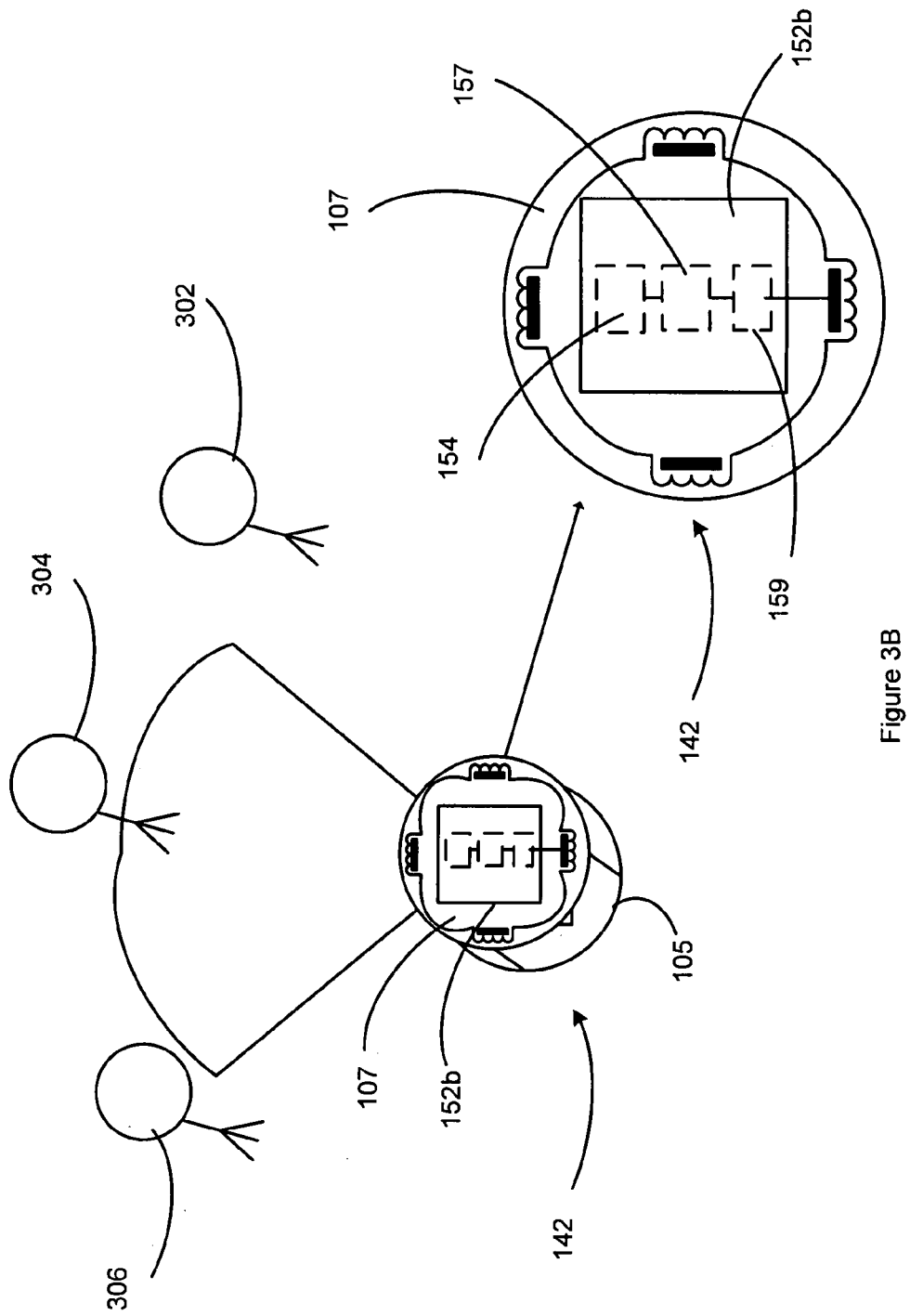
FIG. 3B illustrates a diversity antenna located on a second side of a tracking device to support message communication in accordance with an embodiment of the present invention.

In one embodiment, the second fill area 239b may be disposed with a metallic material forming a multiple surface patch antenna, e.g., dual patch antennas 152a, 152b, to improve receiver sensitivity and/or improve signal reception (see FIG. 3 for a more detailed discussion of the dual patch antenna 152a, 152b). In one variant, multiple filling areas, such as the first fill area 239a, near the electronic components 141 may be processed at a lower temperature and pressure, cooled, and impurities and air bubbles removed from the electronic components 141. Continuing with this same variant, processing of a second fill area 239b proximate to (e.g., surrounding the first fill area 239b) may proceed at a higher temperature with minimal degradation to the integrated circuit because the first fill area 239a forms a protective heat barrier for heat sensitive integrated circuits, e.g., circuits 146, 150 shown in FIG. 1. In one variant, the first fill area 239a has a higher temperature resistance than a temperature capability of the integrated circuit mounted on the PCB 143 (but a lower temperature resistance than the second fill area 239b); therefore, the integrated circuits, e.g., circuits 146, 150, as shown in FIG. 1, are protected from a higher temperature injection material, for instance, utilized to fill the second fill area 239b, e.g., including antennas 152a, 152b.

In another embodiment, if more than one injector applies the molding material, a plastic composite material mass flow rate distribution may be realized having a more uniform distribution; thus, board materials and electrical components may be subjected to reduced tensile pressure per unit area, e.g., preventing damage, for instance, of a PCB 143 and the integrated circuits, e.g., circuits 146, 150. As such, the present invention advantageously provides a lower pressure resin mass flow rate and more uniform plastic composite material application than a conventional mold tool utilizing a single injector entry, single application molding, and a single injector exit port.

In another non-limiting example, the plastic composite material, in one example, includes a filler material or weighing material, that bundles with, for example, a binder disposed in or with the plastic composite material. In one variant, a filler material, such as a glass fiber, glass ball or carbon fiber being chopped and applied to the plastic composite material, e.g., such as polycarbonate and acrylonitrile-butadiene-styrene (ABS) copolymer or others listed above. In one embodiment, the glass fiber or glass balls have a low dielectric constant, e.g., approximately 2.2. Continuing with this variant, the filler material provides have a low-loss tangent at signal transmission frequencies (such as at CDMA and GSM frequency ranges) to enhance electrical signal conductivity, such as for antennas 152a, 152b. Furthermore, the filler material should maintain a high tensile strength to prevent electronic package breakage if inadvertently struck against a hard or sharp surface.

One advantage of the present invention packaging approach is the plastic composite material bonds directly to the electronics components 141 to form a tracking device 142 having an enclosed package that is substantially hermetically sealed. In one embodiment, if the tracking device 142 is discovered by an assailant, it would be difficult to view its internal components, because attempted removal of the plastic composite material (e.g., flowed over the PCB 143) would substantially destroy electronic circuits 141. Thus, it would be difficult to inspect the electronic components 141, as compared to conventional electronic packages having a lid or an encapsulated package where removal of the package causes minimal damage to any electronic components disposed therein.

Furthermore, the disclosed packaging approach is resistant to failure of electronic components 141 being dropped as compared to conventional electronic packages having poor resistance to shock, vibration, moisture, and other environmental factors (e.g., snow). Because of this durability, the tracking device 142, for instance, may be incorporated on child's person, such as part of a shoe or in a collar of a child's shirt, that may strike an object, be accidentally placed in a clothes washing machine, or be exposed to water.

Another advantage is the thermoplastic resin color and/or texture may be selected to match a particular design or pattern. The resin color and texture, in one instance, blends or camouflages the tracking device 142 in its surroundings. In one embodiment, in contrast to many conventional tracking devices having a highly distinguishable and noticeable (e.g., by would be assailant), the size, style and color of the tracking device (such as tracking device 142) blends as part of a room decoration or room ornament, so if discarded by an individual (to prevent detection) its design is disguised to prevent destruction by an assailant (and to provide last know location to a monitoring device terminal). In another embodiment, as compared to many conventional tracking devices, the tracking device 142 is substantially water impermeable and resistant to environmental conditions, such as rain, snow, wind and vibration.

Referring to FIG. 2D, electronic packaging process described above in FIGS. 2A-2C, may be modified to provide packaging for temperature sensitive electronic components. Temperature sensitive electronic components may include a Low Noise Amplifier (LNA), RF Transceiver unit (RF transceiver), or Central Processing Unit (CPU) produced from a heat sensitive or temperature sensitive material. The electronic packaging process described above is modified to form an electronic tracking package in two mating sections, e.g., sections 264, 266. Each mating section 264, 266 is formed utilizing one plastic perform unit having a substantially identical footprint (e.g., backside, front side, thickness, and the like) of the electrical circuit board, such as PCB 143, to insert therein except that the perform unit includes additionally dimensionality conforming to a desired shape of a mating lip 260, or a seam 262. After producing both mating sections 264, 266, the perform unit is removed. Electronics components 141 populate the mating sections 264, 266 (including the antennas 152a, 152b) as well as other components. The mating sections 264, 266 are snapped or glued together, e.g., using a commercially available epoxy composition, along the mating lip 260 or seam 262, to form a substantially sealed, polycarbonate electronic package.

Antenna Design

Referring to FIG. 3, a multi-patch antenna, e.g., microstrip patch antennas 152a, 152b, in one example, disposed proximately to electronic package surfaces 105, 107. In one embodiment, the microstrip patch antennas 152a, 152b are positioned parallel on opposing faces of the tracking device 142. In one embodiment, the microstrip patch antennas 152a, 152b are quarter-wave length microstrip patches deposited on an alumina substrate. In one example, the operating frequency range of the microstrip patch antenna is 3 GHz, but may be selected to support an operating frequency range of a skyward satellite or an RF base station. In one example, a separation distance between parallel microstrip patch antennas 152a, 152b may be approximately 0.1 Lambda (wavelength); however, the separation distance may be any distance that supports signal spatial separation between the antennas. In one variant, deposited between the microstrip patch antennas 152a, 152b, a fill material, for example, of a dielectric constant (Er) between 3 to 9 allows a decreased separation distance, e.g., to provide smaller electrical package size and provide communication signal spatial differentiation, between the microstrip patch antennas 152a, 152b.

Electrically coupled to the antennas 152a, 152b, are low noise amplifiers 120a, 120b (shown in FIG. 1) to increase received signal power level. During a tracking device startup procedure, e.g., satellite communication signal acquisition phase, a receiver 144 receives location coordinates, such as GPS coordinates, from one or more base stations or satellites, such as satellites 302, 304, and 306. The receiver 144 mounted on the tracking device 142 to measures a snapshot of a receive signal strength on patches 152a, 152b. Referring to FIG. 1, after measuring a snapshot of signal strength, the low noise amplifiers (LNAs) 120a, 120b and the receiver 144 and transmitter 146 shifts to a low power state, e.g., substantially sleep state with a nominal quiescent current, to reduce current drain; therefore, tracking device battery charge is conserved. In a low power state, a Global Positioning System (GPS)/Global Positioning Radio System (GPRS) based processor, e.g., an NXP semiconductor GPS processor 150 (see FIG. 1) processes a snapshot, e.g., 10 ms to 100 ms, of raw location coordinates received from each of the patches 152a, 152b.

In one embodiment, the resulting analysis of the snapshot of raw location coordinates determines which of the antennas, e.g., patches 152a, 152b, predict (based on previous snapshot measurements) better receiver sensitivity for future signal acquisition. In another embodiment, the resulting analysis from each of the patches 152a, 152b provides information on a percentage of battery power to direct to a tracking device's electrical components, e.g., LNAs 120a, 120b, patches 152a, 152b, to maximize signal directivity of the tracking device. Consequently, the invention provides for shifting and/or supplying power to one or multiple antennas, e.g., first patch 152a or the second patch 152b, in response to a location orientation of the tracking device 142 to a monitoring tower or station, e.g., a base station or a satellite. Thus, this approach extends battery life of a tracking device 142 and provides capability to achieve as close as possible 360 degree view of the sky.

In contrast, many conventional tracking systems (during startup procedure) obtain their positional coordinates signal over several minutes; thus, tracking device battery power is depleted (due to an extended startup procedure). Still other conventional mobile tracking device's have one fixed antenna, which may or may not be oriented skyward to a satellite; thus, these systems cause low receiver sensitivity and may not provide adequate antenna directivity to receive location coordinates of a tracking device. More importantly, other conventional mobile tracking device's having one or more fixed antennas oriented in one direction deplete available battery level when out of orientation with a skyward satellite or base station than the present invention multiple antenna approach that responsively transmits power (e.g., to components (LNA, transceiver, or the like) to an appropriate antenna, e.g., patch 152a, 152b, to maximize battery charge.)

In one variant of this embodiment, one or more microstrip patch antennas may be attached to additional sides of a tracking device (for instance if the tracking device is square or rectangular shaped) to realize further improved tracking device directivity and control and increase a receiver sensitivity to weak signals received skyward from a satellite or from a base station monitoring tower. In another variant, the LNAs and the transceivers may be replaced by multiple voltage or current adjustable gain or output power controlled LNAs and/or multiple voltage or current adjustable gain controlled transceiver(s). Continuing with this variant, the adjustable gain or output power LNAs and/or transceivers may be electrically coupled and switched into and out of a signal path of one or more of the antennas, e.g., patches 152a, 152b, to realize a multi-path, multigrain tracking unit with more options to increase receiver sensitivity, including attenuation of high power or adjusting a signal level communicated. In still another variant, each of the patches 152a, 152b may be replaced by one or more antenna patches on the same side, e.g., a patch array antenna, to achieve additional signal acquisition control.

Battery Charging

Figure 4B:
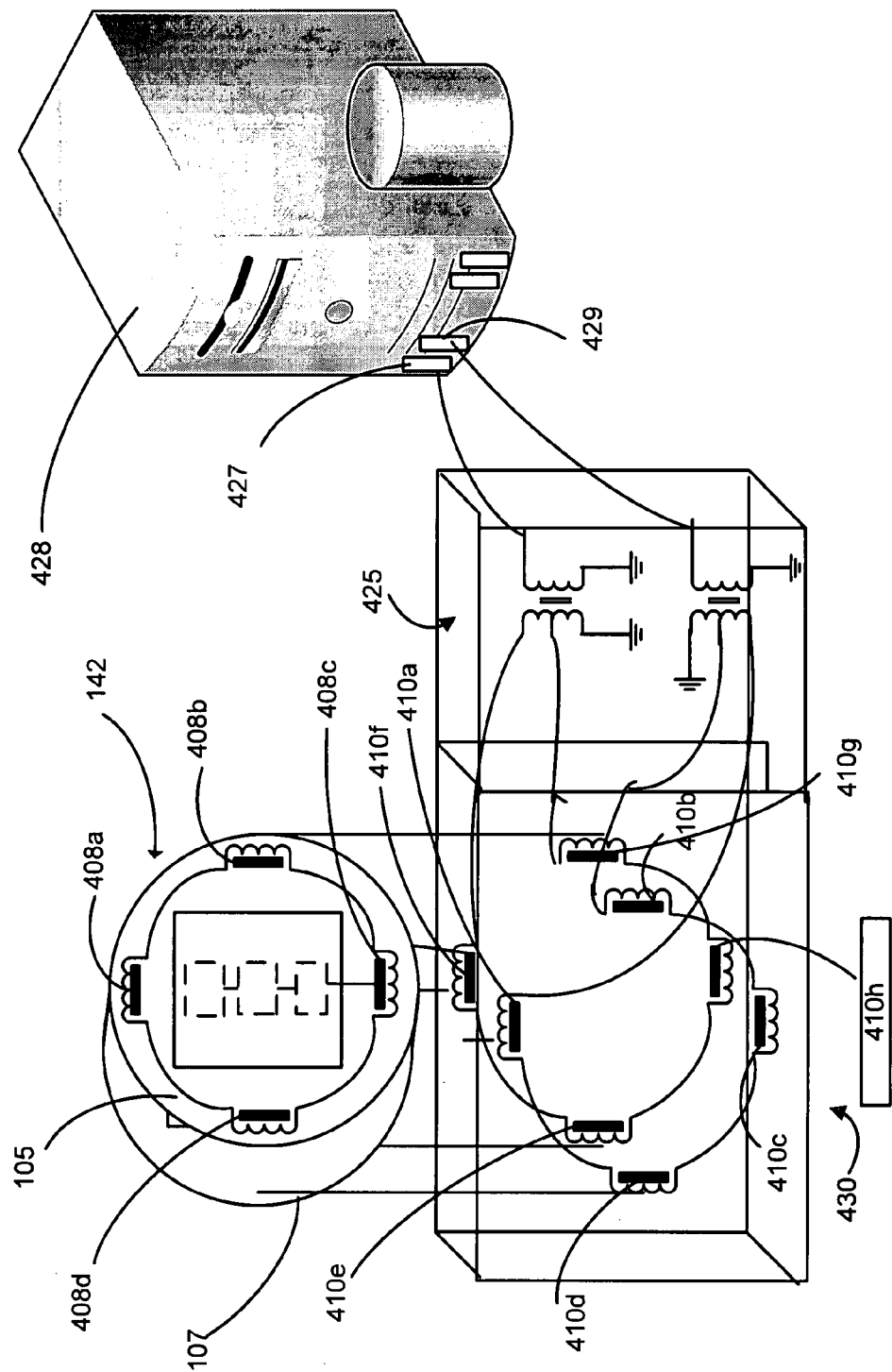
FIG. 4B illustrates wireless battery charging circuitry of a tracking device and a dual-sided inductive charging unit in accordance with an embodiment of the present invention.

Referring to FIGS. 4A-4D, a various embodiments of battery chargers are disclosed. Referring to FIG. 4A, the battery charger 420 requires no external metal contact points, e.g., DC, RF, and AC inputs. In this embodiment, the inductive charging pad 420 provides a surface, e.g., horizontal surface that electrically couples to a voltage/current transformer 424. Wire-wound ferrite inductive cores 408a-d (depicted in FIG. 1 as blocks 131a-d) are, for instance, mounted on the circuit board 143 of the tracking device 142 and are electrically coupled (e.g., using wires) to a switching circuit, e.g., demodulator 159, and afterwards to one or rechargeable batteries, e.g., battery 154. About the antenna patches 152a, 152b, inductive charging flux paths through the plastic package 142 couple electromagnetic energy from one or more wire-wound inductive cores, such as ferrite cores 410a-d, (e.g., located within an inductive charging pad 420) receiving electrical energy from a computer connection, e.g., USB port 426 to inductive cores 408a-d. In one embodiment, the inductive charging pad 420 provides near field communication between the tracking device 142 and a computer monitoring station, such as computer 428. Signal demodulator 159 demodulates a low frequency signal received from magnetic flux from the inductive charging pad 420 (e.g., the low frequency signal originated from a computer connection, e.g., USB port 426.) The near field communication communicates periodic tracking device software updates, data downloading/uploading, and other tracking device firmware updates.

In one embodiment, a voltage/current transformer, e.g., voltage/current transformer 421, couples energy, for instance, from a standard AC wall outlet 418 converting a 220V output voltage level, for example, to a 15 volt voltage level. In this example, magnetic flux transfer ac flux from the inductors 410a-d to the inductors 408a-d. On the tracking device 142, a demodulator circuit 159 and a battery charging circuitry 157 provide a dc voltage level to the battery 154 (as shown in FIG. 1).

Referring to FIG. 4B, a dual-sided inductive charging unit 430 (with transformer 425) charges the tracking device 142 using multiple tracking device sides 105, 107 to provide increased battery charging capability. Increased battery charging capability is achieved by an increased inductive flux contact between inductive components, e.g., 408a-d, between the tracking device 142 and inductive components, e.g., 410a-h, within the inductive charging unit 430. In one example, the inductive charging unit 430 includes a transformer 425 to obtain AC/DC power and/or low frequency wireless communication from a computer connection, e.g., USB ports 427, 429, of the computer 428. In one variant, inductive components 408e-h (a second circle of inductors to the tracking device 142) may be added to further increase magnetic flux between a tracking device and inductive components, e.g., 410a-h).

Figure 4C:
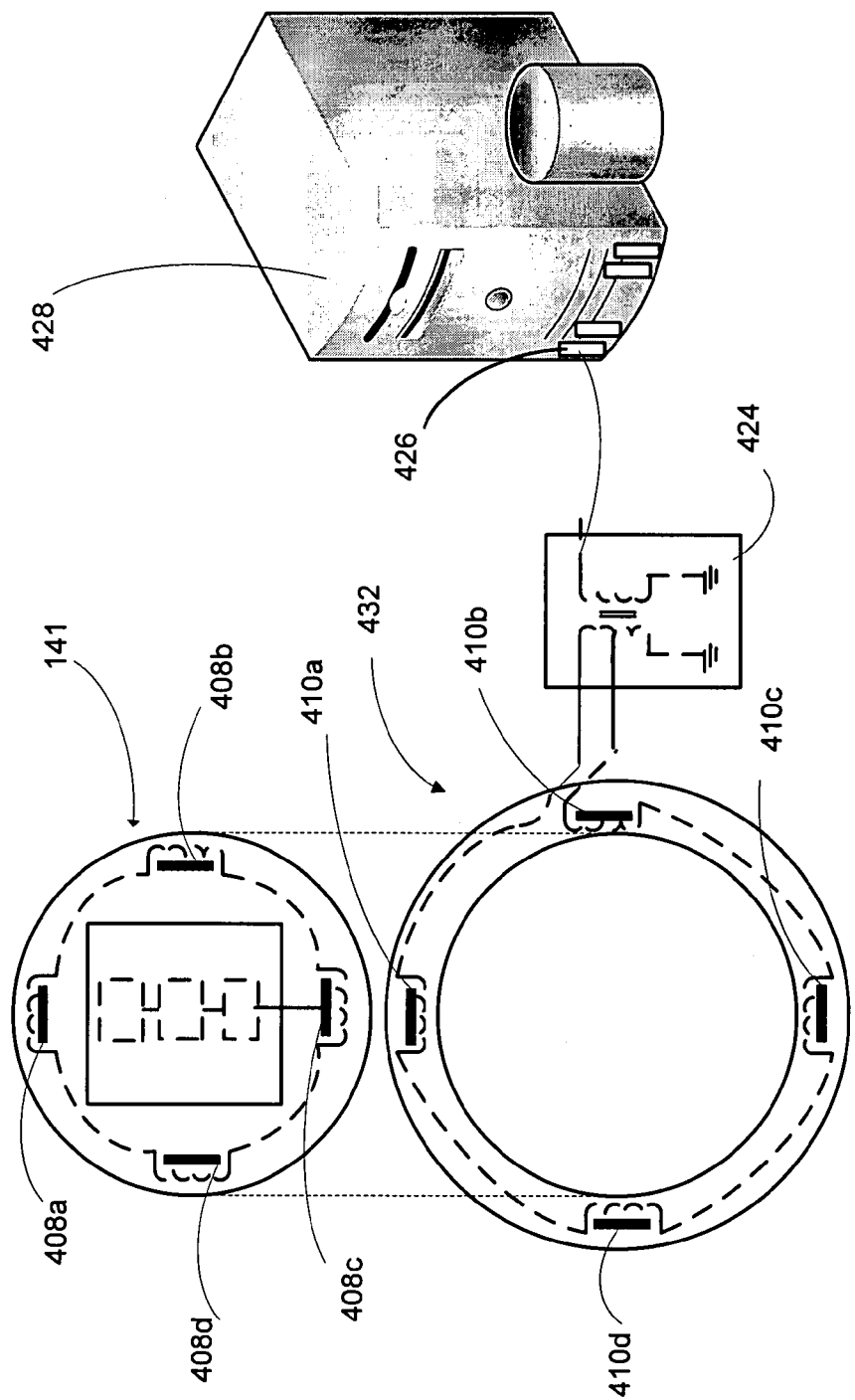
FIG. 4C illustrates wireless battery charging circuitry of a tracking device and a first conformal-shaped inductive charger in accordance with an embodiment of the present invention.
Figure 4D:
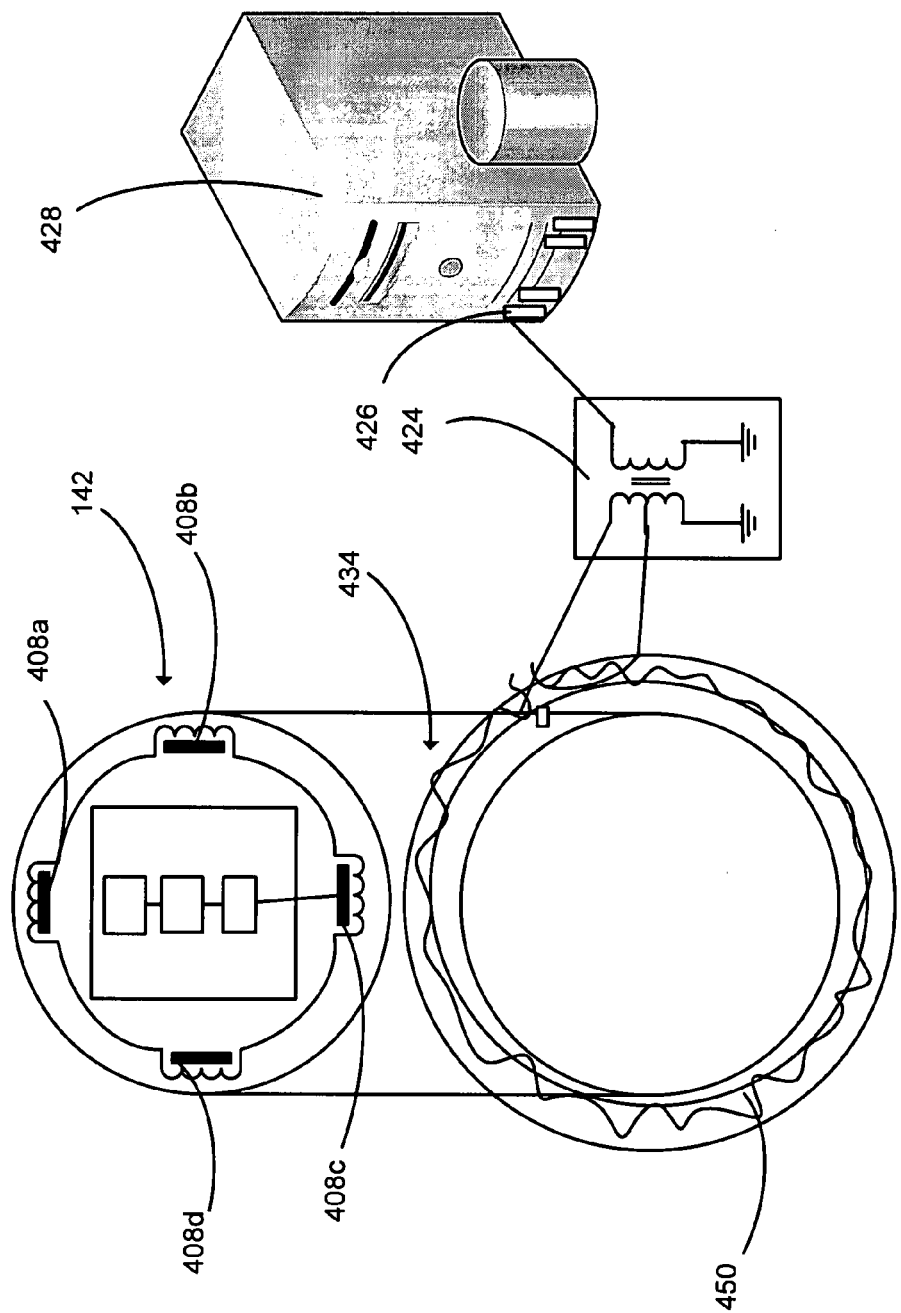
FIG. 4D illustrates wireless battery charging circuitry of a tracking device and a second conformal-shaped inductive charger in accordance with an embodiment of the present invention.
Figure 4E:
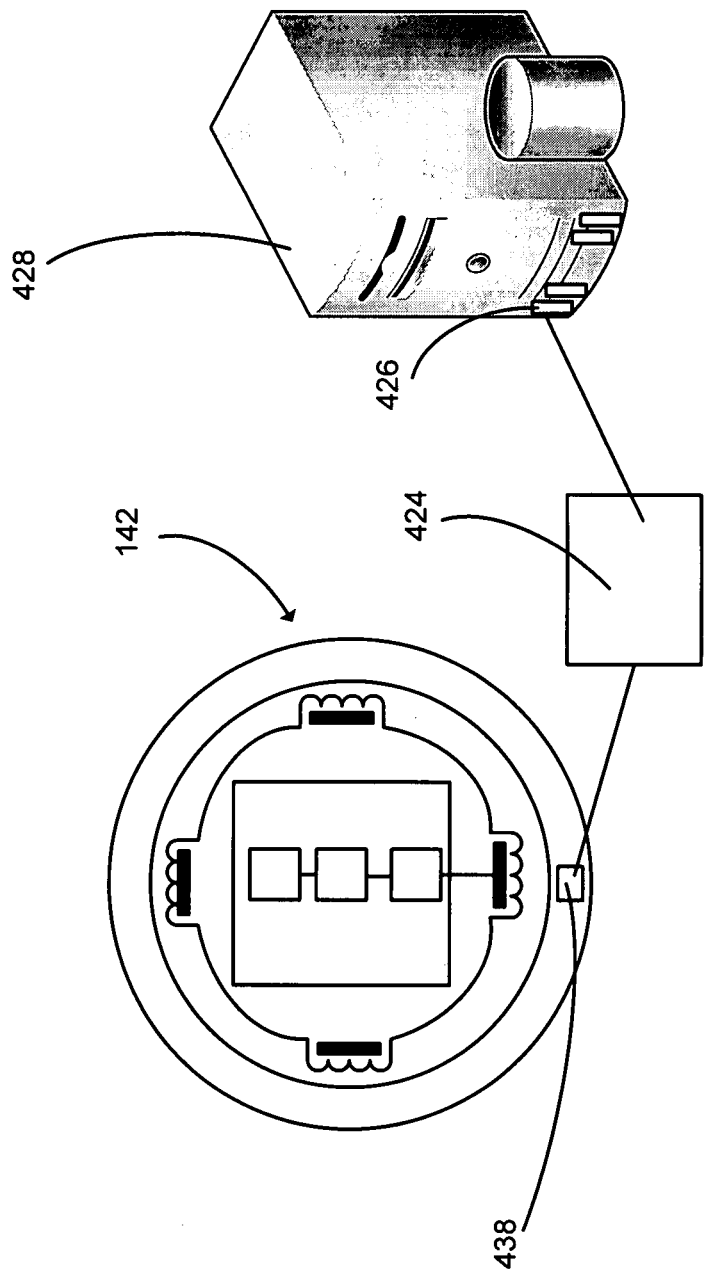
FIG. 4E illustrates wired battery charging connection of a tracking device in accordance with an embodiment of the present invention.

Referring to FIGS. 4C, 4D, conformal inductive chargers 432, 434 (including one conformal, ferrite core inductor 450), e.g., side inductive coupled units, are realized with the tracking device 142. In one example, the inductive chargers 432, 434 connect through a transformer 424 to obtain AC/DC power and/or low frequency wireless communication signals. Referring to FIG. 4E, a tracking device 142 is illustrated having an electrical connector, e.g. USB connector 438, to charge the battery 154 when electrically coupled between a transformer 424, e.g. through a USB connector 426, to a computer 428.

Figure 5:
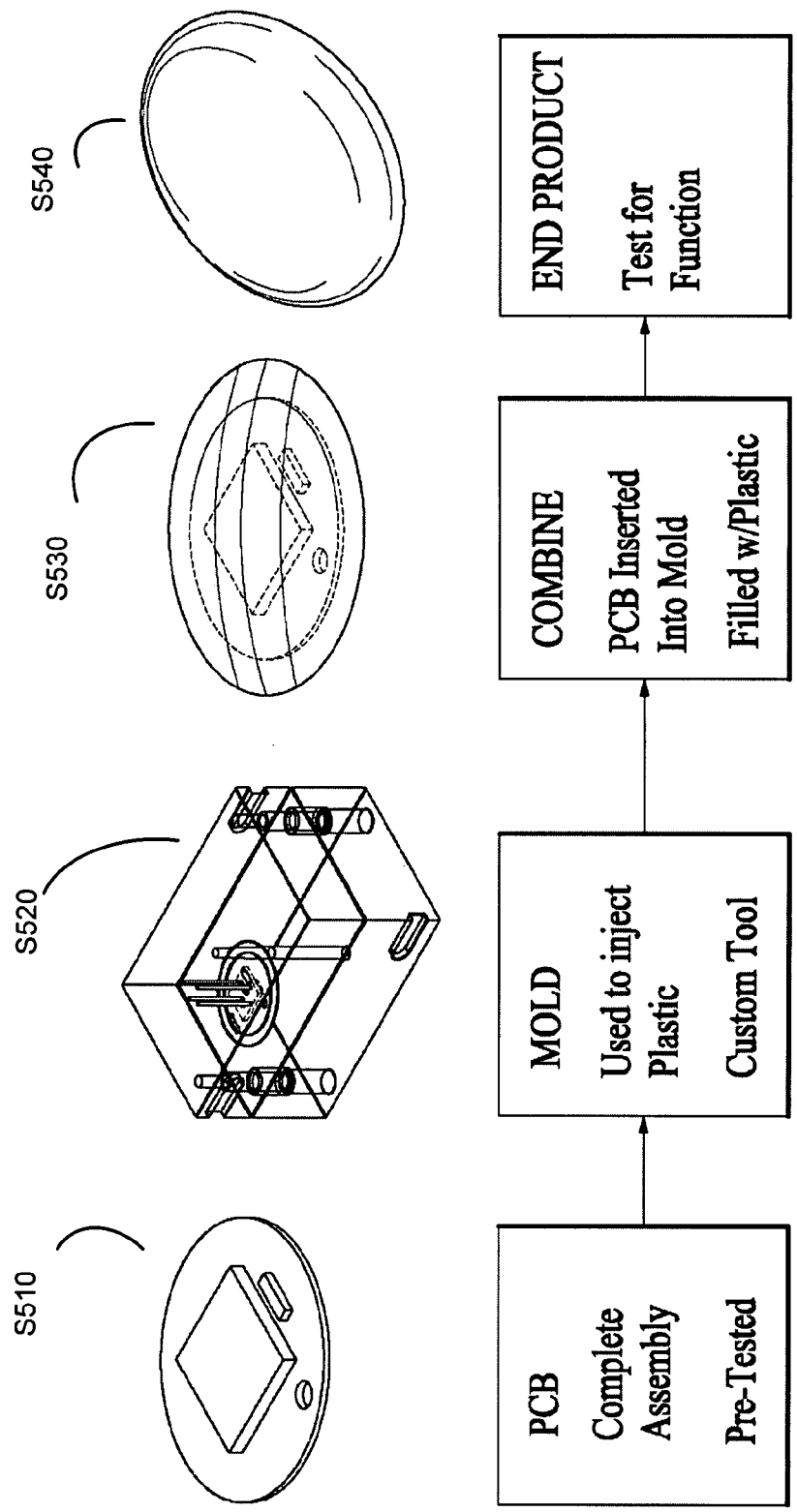
FIG. 5 illustrates a flow chart of the injection molding process in accordance with one embodiment of the present invention.

Referring to FIG. 5, a flow chart 500 illustrates one example of an injection molding process (as described above in FIGS. 2A-2D) in accordance with one embodiment of the present invention. In step 510, electronic components 141 are placed in the mold tooling 240 (see FIG. 2A). In step 520, a thermoplastic resin is injected into the mold (as shown in FIGS. 2B and 2C). In step 264, the electronic components 141 are enclosed by the thermoplastic resin as shown in FIGS. 2B and 2C). In step 530, the mold tooling 240 is removed and the tracking device 142 is formed. In step 540, the tracking device 142 is tested.

Figure 6:
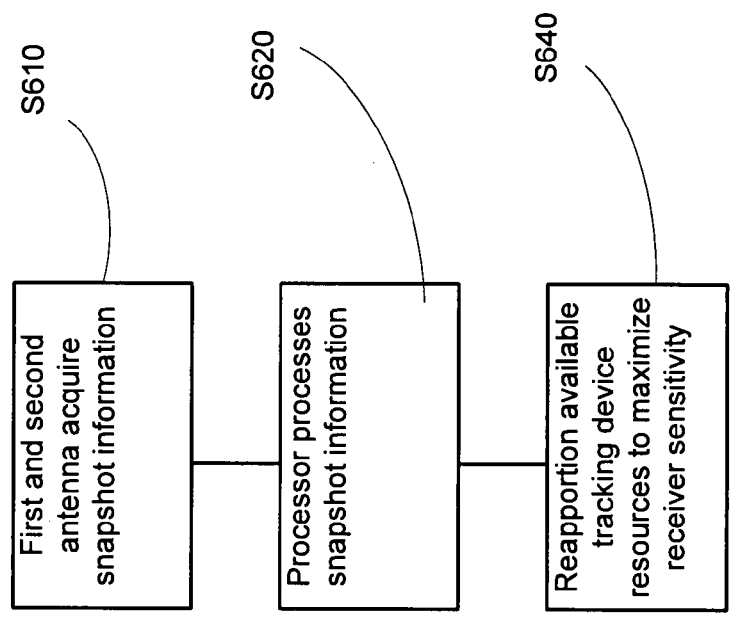
FIG. 6 illustrates a flow chart to manage battery power usage of a tracking device in accordance with one embodiment of the present invention.

Referring to FIG. 6, a flow chart 600 illustrates a signal acquisition procedure (as described above in FIG. 3) in accordance with one embodiment of the present invention. In step 610, a first patch 152a and a second patch 153b acquire a snapshot of receive signals. In step 620, a processing unit, e.g., 148, 150, processes the snapshot of the receive signals. In step 640, the processing unit communicates battery power management instructions to electrical components associated with the first patch 152a and the second patch 152a to increase receiver sensitivity, antenna directivity, and maximize battery power usage.

It is noted that many variations of the methods described above may be utilized consistent with the present invention. Specifically, certain steps are optional and may be performed or deleted as desired. Similarly, other steps (such as additional data sampling, processing, filtration, calibration, or mathematical analysis for example) may be added to the foregoing embodiments. Additionally, the order of performance of certain steps may be permuted, or performed in parallel (or series) if desired. Hence, the foregoing embodiments are merely illustrative of the broader methods of the invention disclosed herein.

While the above detailed description has shown, described, and pointed out novel features of the invention as applied to various embodiments, it will be understood that various omissions, substitutions and changes in the form and details of the device or process illustrated may be made by those skilled in the art without departing from the spirit of the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A tracking device comprising:
    a transceiver for transmitting and receiving one or more location and tracking signals, the one or more location and tracking signals carrying information regarding location of the tracking device;
    a printed circuit board substrate comprising wireless location and tracking circuitry to assist in monitoring location coordinates of an object or individual attached thereto;
    a first patch antenna mounted on a first surface of the tracking device;
    a second patch antenna disposed substantially parallel to the first patch antenna and mounted on a second surface of the tracking device, the second surface opposed to the first surface of the tracking device, wherein the first surface is in a different plane than the second surface;
    wherein the first patch antenna and the second patch antenna are configured to periodically communicate signals to the wireless location and tracking circuitry processor to determine if the first patch antenna or the second patch antenna provides optimal antenna performance when the transceiver is placed in a low-power mode or when the tracking device has an at least partially obstructed communication path; and
    wherein the signals configured to determine optimal antenna performance are processed by the tracking device using a sampling interval that is substantially less than a duration of one or more communicated location and tracking signals.

2. The tracking device of claim 1, further comprising inductive charging circuitry coupled to a charge storage unit within the tracking device.

3. The tracking device of claim 1, further comprising memory to store a first identification code to identify an object or individual associated with the tracking device to at least one of a user and an information server.

4. The tracking device of claim 1, wherein the wireless location and tracking circuit communicates with a server that stores informational profile of an individual or an object to monitor or track and communicates the informational profiles in accordance with authorization criteria in both a secure and an insecure manner.

5. The tracking device of claim 1, wherein the tracking device is capable of selectively communicating location coordinates with other tracking devices in a secure manner.

6. The tracking device of claim 1, wherein the tracking device is capable of computing its location coordinates utilizing location coordinates of other tracking devices in response to at least one of inadequate signal strength and last known positional coordinates within an adequate signal strength area of the tracking device.

7. The tracking device of claim 1, further comprising a battery; inductive charging circuitry to provide non-contact power charging of the battery; and an electronic package configured to conform to a shape of an inductive charger located proximal to the tracking device.

8. The tracking device of claim 1, further comprising a demodulator circuit; a battery, battery charging circuitry, and inductive charging circuitry magnetically coupled to a location and tracking device monitoring station through an inductive charging station to provide a near field communication link.

9. The tracking device of claim 1, further comprising inductive charging circuitry and a demodulator circuit to provide battery charging capability to the tracking device and a near field communication link with a proximally located monitoring station.

10. The tracking device of claim 1, further comprising an electronic package shaped to conform to shape of a proximately located battery charger unit that magnetically couples to the tracking device, the tracking device configured to receive at least one of battery charging signals or near field electrical signals from the battery charger unit electrically coupled to a transformation network from either a computer or a standard AC wall outlet.

* * * * *